United States Patent [19]

Heinecke et al.

[11] 4,328,261

[45] May 4, 1982

[54] METALLIZING SEMICONDUCTOR DEVICES

[75] Inventors: Rudolf A. H. Heinecke, Harlow; Ronald C. Stern, Cheshunt, both of England

[73] Assignee: ITT Industries, Inc., New York, N.Y.

[21] Appl. No.: 199,799

[22] Filed: Oct. 23, 1980

Related U.S. Application Data

[63] Continuation-in-part of Ser. No. 91,285, Nov. 5, 1979, abandoned.

[30] Foreign Application Priority Data

Nov. 9, 1978 [GB] United Kingdom ............... 43914/78
Nov. 8, 1979 [GB] United Kingdom ............... 38793/79

[51] Int. Cl.³ .......................................... H01L 21/285
[52] U.S. Cl. ........................................ 427/91; 427/99; 427/229; 427/252; 427/255.2
[58] Field of Search .................. 427/91, 99, 252, 229, 427/255.2; 357/67

[56] References Cited

U.S. PATENT DOCUMENTS

| | | | |
|---|---|---|---|
| 3,219,482 | 11/1965 | Jenkin | 427/91 |
| 3,382,568 | 5/1968 | Kuiper . | |
| 3,413,157 | 11/1968 | Kuiper . | |
| 3,449,150 | 6/1969 | Williams et al. | 427/229 |
| 3,620,837 | 11/1971 | Leff et al. | 427/91 |
| 3,740,835 | 6/1973 | Duncan | 427/91 |
| 3,881,242 | 5/1975 | Nuttale | 427/91 |
| 3,918,149 | 11/1975 | Roberts | 427/88 |

FOREIGN PATENT DOCUMENTS

| | | | |
|---|---|---|---|
| 2309506 | 8/1974 | Fed. Rep. of Germany | 427/91 |
| 2702282 | 7/1978 | Fed. Rep. of Germany | 427/91 |

*Primary Examiner*—John D. Smith
*Attorney, Agent, or Firm*—John T. O'Halloran; David M. Quinlan

[57] ABSTRACT

Silicon semiconductor devices, e.g. integrated circuits are metallized with a silicon/aluminum alloy by exposure to silane and an aluminum alkyl vapour at an elevated temperature and reduced pressure. The process eliminates the prior hydrogen plasma treatment and subsequent annealing of conventional vacuum deposition of aluminum and provides good step and crack coverage.

14 Claims, 2 Drawing Figures

METALLIZING SEMICONDUCTOR DEVICES

CROSS-REFERENCE TO RELATED APPLICATION

This application is a continuation-in-part of application Ser. No. 091,285, filed Nov. 5, 1979 now abandoned.

BACKGROUND OF THE INVENTION

This invention relates to metallization of semiconductor devices and in particular to a method of and an apparatus for the deposition of aluminum on silicon devices including integrated circuits.

Conventional metallization processes for integrated semiconductor circuit manufacture require expensive high vacuum equipment in which evaporated or sputtered electrically conductive material, usually aluminum, is transported along a straight trajectory from a localized source. This "line of sight" technique has the disadvantage of a limited process wafer throughput in that the wafers have to be distributed usually by loading them in to an array of dishes carried on a planetary motion mechanism. During a deposition run the front surface of each wafer "sees" the vapour source and is coated with the conductive material.

Another disadvantage of the "line of sight" coating process is the inadequate coating, due to shadowing effects, of steps and irregularities in the process wafers. Furthermore, the high energy required in conventional vacuum processing for rapid atomization of the conductive material by electron beam evaporation and sputtering techniques produces considerable interface damage to metal-ozide silicon (MOS) devices. This damage must subsequently be annealed out by heating the devices to a relatively high temperature, e.g. 470° C. At such temperatures the solubility and diffusion rate of silicon in aluminum are high enough to cause the formation of etch pits in the contact window areas of the devices thus degrading the underlying junctions. This effect is particularly deleterious in the case of very large scale integration (VLSI) where shallow junctions are employed.

To remedy this situation the semiconductor industry has generally adopted the technique of depositing 1% silicon in aluminum alloys to maintain the metallization saturated with silicon when heated to the annealing temperature. This technique however introduces further problems. For example, due to difficulties in film composition control, films with silicon concentrations far in excess of the solubility limit are deposited. Such films present etching difficulties and, due to the considerable reduction of the solubility of silicon in aluminum with decreasing temperature, p-type silicon is precipitated particularly in the contact window areas. This precipitated silicon increases the effective Schottky barrier height to n-type material and consequently increases the contact resistance.

SUMMARY OF THE INVENTION

The object of the invention is to minimize or to overcome the above mentioned disadvantages.

Our co-pending U.S. patent applications, Ser. No. 034,067 and 034,068, filed Apr. 27, 1979, which claim priority based on British patent applications, Ser. No. 22632/78 and 22633/78, respectively, filed May 25, 1978, which have been abandoned in favor of U.S. continuation patent applications Ser. No. 168,848 and 168,845, respectively, filed July 10, 1980, and which are assigned to the same assignee as the present invention, describe a process for providing an aluminum coating on a work piece by the thermal decomposition of tri-isobutyl aluminum (TIBA) supplied in vapour form to a reaction chamber maintained at a temperature in the range 250°-270° C., and in which the TIBA, prior to entry into the reaction chamber, is maintained at a temperature below 90° C.

For certain applications this process requires prior hydrogen plasma treatment of the process wafers.

According to the present invention there is provided a process for metallizing a semiconductor device with a silicon/aluminum alloy coating, including exposing the device to an aluminum alkyl vapour and silane.

No special pretreatment of the semiconductor device is required. The process according to a first aspect of the invention consists of a single one step deposition/annealing operation wherein aluminum films, saturated at the deposition temperature with silicon, are deposited from a mixture of an aluminum alkyl and silane at low pressure. The deposition temperature is chosen between 250° and 500° C. and preferably between 300° and 400° C., to provide optimum annealing and alloying characteristics of the particular semiconductor device being treated. The hydrogen liberated in the decomposition of the aluminum alkyl and silane enhances the annealing efficiency of the process.

According to another aspect of the invention, there is provided a process for metallizing a semiconductor body with a silicon/aluminum alloy including first exposing the body to an aluminum alkyl vapour at a temperature of 200° to 350° C. so as to deposit a coating of aluminum on the body, and then exposing the aluminum coated body to silane while raising its temperature to 350° to 550° C. thereby alloying the aluminum film with silicon.

In the alternative sequential deposition technique of the present invention a gas phase alloying operation is employed wherein, following a surface activation stage, aluminum films are deposited by thermal decomposition of an aluminum alkyl at a temperature between 200° C. and 350° C., and preferably between 240° C. and 300° C., to provide optimum decomposition characteristics in terms of film quality and uniformity. Immediately after the aluminum deposition stage silane gas is admitted to the deposition region and the temperature is raised to between 250° C. and 550° C. to saturate the aluminum with silicon to a level required in accordance with subsequent processing and to effect MOS interface annealing and ohmic contact formation. During this gas phase alloying stage it is thought that silane is chemisorbed on the previously deposited aluminum film and then decomposes to form silicon. The latter diffuses into the aluminum film until it is saturated. It appears that, unlike conventional deposition processes, no MOS interface states are generated during chemical vapour deposition and the temperature of this gas phase alloying step, which determines the silicon content of the film, can thus be chosen as low as is compatible with ohmic contact formation and subsequent semiconductor processing.

In a modification of this process the deposition apparatus may have two different temperature zones, the semiconductor workpieces being moved into the hotter zone for gas phase alloying after deposition has been effected. In another modification of this process the aluminum films are deposited by conventional physical means, e.g. evaporation or sputtering, followed by an annealing stage in silane at an elevated temperature.

It has been established that the presence of silane saturates the freshly deposited aluminum films with silicon and avoids the formation of etch pits in contact windows which pits, in the absence of silane, form at temperatures as low as 340° C.

It has been found that the adhesion and the quality of the deposited films are improved by the exposure of the semiconductor workpiece to a surface activating gas, typically titanium tetrachloride, prior to deposition.

The temperatures employed are comparable with subsequent processing to provide scratch protection layers and chip mounting. The process provides silicon-/aluminum alloys which are saturated with silicon at such temperature and which are thus not degraded by such subsequent processing.

BRIEF DESCRIPTION OF THE DRAWINGS

An embodiment of the invention will now be described with reference to the accompanying drawings in which.

DETAILED DESCRIPTION OF THE PREFERRED EMBODIMENT

Figure 1:
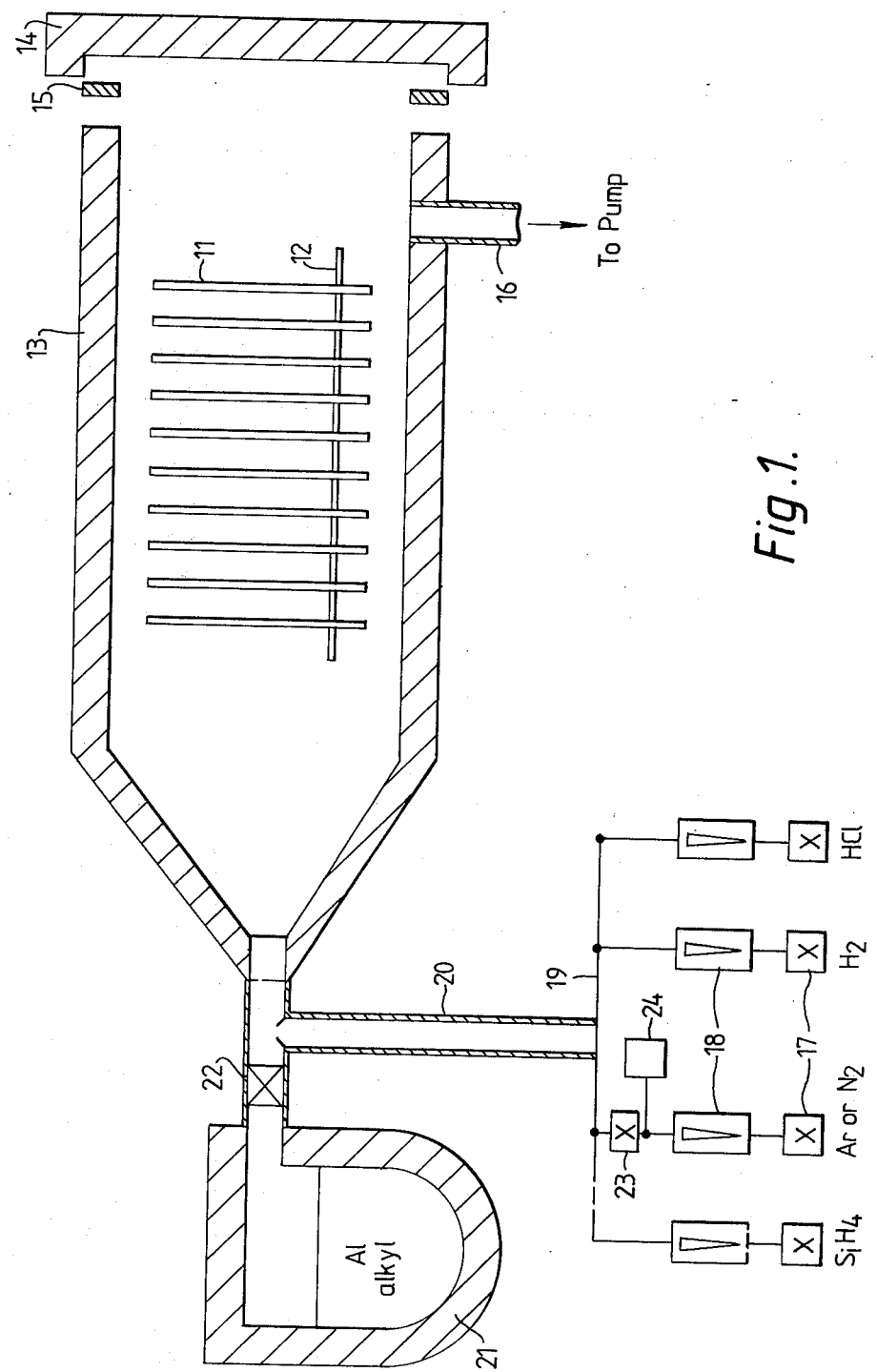
FIG. 1 is a schematic diagram of a semiconductor metallization plant and FIG. 2 is a schematic diagram of a semiconductor metallization plant having provision for surface activation prior to metallization.

Referring to the drawings silicon process wafers 11 to be metallized are disposed on an inert, e.g. silica, boat or carrier 12 and placed in a furnace chamber 13 sealed by a door 14 and gasket 15. The furnace 13 is evacuated via a side entry tube 16, heated to the required deposition temperature and purged with an inert gas, e.g. argon, supplied via a valve 17 and flowmeter 18 from a gas supply manifold 19 feeding a tube 20 communicating with the furnace 13. After purging the gas supply is turned off and the furnace is again evacuated. The process wafers 11 may in some applications be cleaned by admitting e.g. hydrogen chloride vapour via the manifold 19 into the furnace 13 following which the furnace is again evacuated, although in many cases this cleaning step may be omitted.

Figure 2:
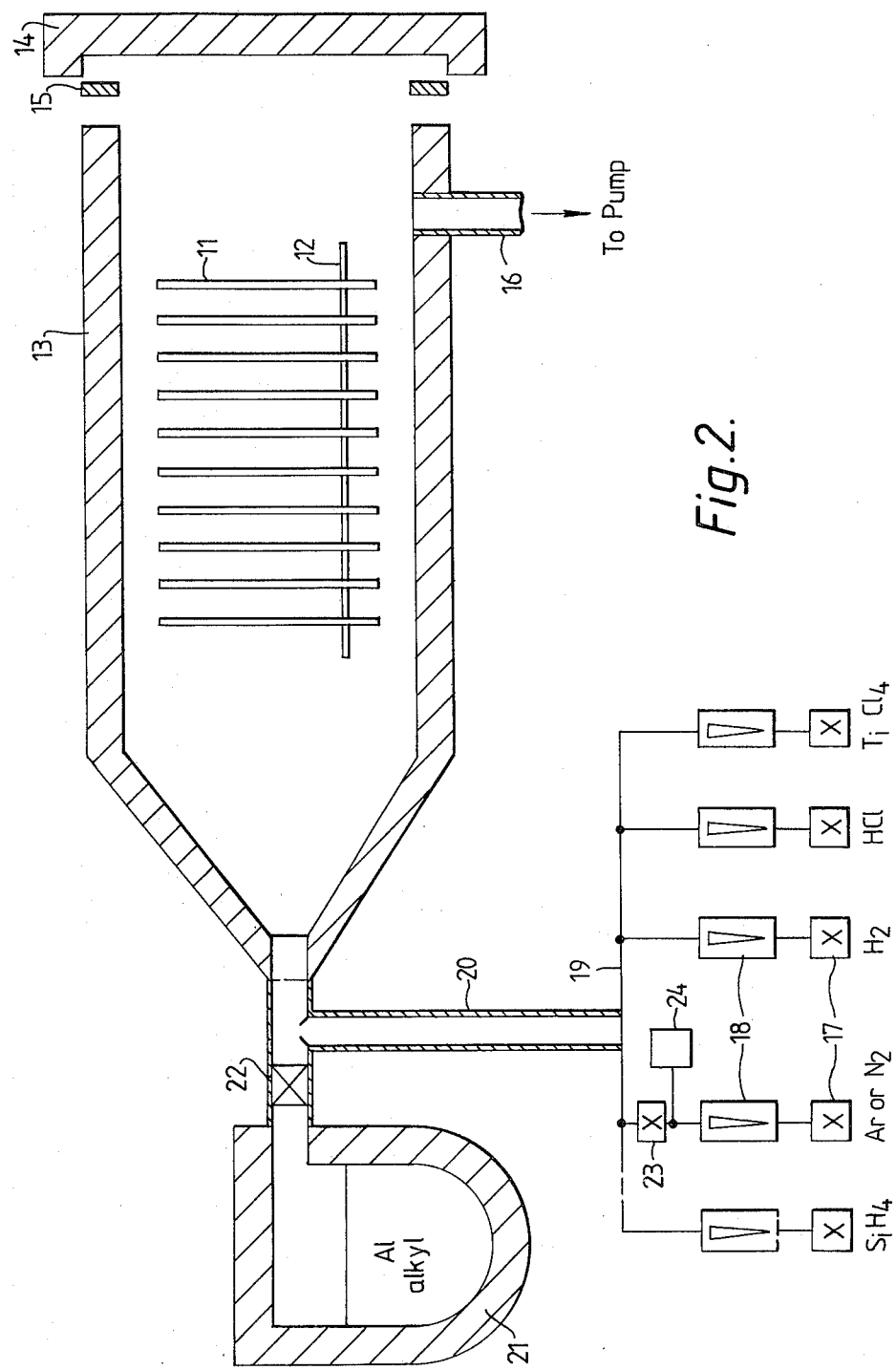

Advantageously the process wafers may next be exposed to titanium tetrachloride vapour via manifold 19, as shown in FIG. 2, following which the furnace is re-evacuated.

Deposition of a silicon/aluminum alloy on the wafers is effected by admitting an aluminum alkyl vapour for example, TIBA, or mixtures of aluminum alkyls, from a temperature controlled reservoir 21 containing the liquid alkyls via a valve 22 into the furnace 13 and simultaneously admitting silane via the manifold 19 into the furnace 13. The alloy deposits spontaneously on the process wafers 11 by a thermal decomposition process. The process of incorporation of silicon in the deposited alloy film appears to be self limiting according to the solubility limit of the silicon in aluminum at the deposition temperature. Thus the concentration of silane is not critical although, of course, if the silane concentration is far in excess of that required to saturate the aluminum the film deposition rate is drastically reduced and poor quality films are obtained. Silane partial pressures in the range of 0.15 to 2.0 torr have been employed. We prefer, however, to employ a partial pressure of silane in the range of 0.25 to 0.3 Torr.

When the deposition is complete the silane and aluminum alkyl supplies are switched off, and the furnace is brought up to atmospheric pressure with inert purge gas. The coated process wafers are then ready for patterning and no further annealing or alloying is required.

In the alternative sequential deposition process the wafers 11, preferably surface activated with titanium tetrachloride vapour, are exposed to TIBA vapour supplied from the temperature controlled reservoir 21 while maintaining the furnace 13 at a temperature of 200° C. to 350° C. Preferably deposition should be effected in the temperature range 240° C. to 300° C. After aluminum deposition has been effected the TIBA vapour supply is removed and the furnace is re-evacuated and its temperature raised to between 350° C. and 500° C. Silane is admitted during the heat-up cycle via the manifold 19 thus effecting silicon deposition and subsequent alloying of the deposited silicon with the aluminum.

After deposition is complete the furnace is re-evacuated, cooled and purged as before.

The sequential process permits independent optimization of the film deposition and the alloying conditions while the simultaneous process offers simplicity by way of a compromise of the deposition and alloying requirements.

Various alkyls may be employed in the process. Thus, for example, tri-methyl, tri-ethyl, tri-isopropyl aluminum, tri-isobutyl aluminum (TIBA) and di-isobutyl aluminum hydride (DIBAH) or mixtures thereof may be employed. For high quality films, TIBA, DIBAH or mixtures thereof should be employed. The temperature at which the alkyl reservoir is maintained is dependent on the evaporation rate of the alkyl or mixture of alkyls. Further, the alkyl/silane mixture, or the alkyl and the silane in the sequential process, may in some applications be diluted e.g. with argon and/or hydrogen, the latter enhancing the annealing efficiency of the process.

A typical process sequence for metallizing silicon process wafers using the apparatus shown in the accompanying drawings is as follows:

1. Load process wafers 11 on to carrier 12 and insert into heated furnace 13.
2. Evacuate furnace to below 0.01 torr.
3. Optionally clean process wafers 11 with e.g. hydrogen chloride and re-evacuate.
4. Surface activate with TiCl$_4$ vapour and re-evacuate. (This step will be omitted when using the apparatus shown in FIG. 1).
5. Effect deposition by supplying silane and aluminum alkyl to furnace 13.
6. Finish deposition and re-evacuate furnace.
7. Bring furnace up to atmospheric pressure with argon or nitrogen.
8. Unload treated wafers while flushing with nitrogen.

In such a deposition process in which the furnace was maintained at 350° C. and deposition was effected from silane and TIBA both supplied at a rate of 200 ml/min. (NPT) at a pressure of 4 torr it was found that a 4 minute deposition period produced an alloy film 1 micron in thickness.

A typical sequential deposition sequence is as follows:

1. Load process wafers onto carrier 12 and insert into heated furnace 13.
2. Evacuate furnace to below 0.01 torr.

3. Optionally clean wafers with hydrogen chloride and re-evacuate.
4. Surface activate wafers with TiCl$_4$ vapour and re-evacuate.
5. Hold furnace temperature at 200° C. to 350° C. and admit TIBA vapour to effect aluminum deposition.
6. Finish deposition and re-evacuate furnace.
7. Admit silane to commence gas phase alloying.
8. Raise furnace temperature to 300° C. to 500° C.
9. Finish alloying and re-evacuate.
10. Bring furnace up to atmospheric pressure with nitrogen and unload wafers while flushing with nitrogen.
11. Cool furnace to aluminum deposition temperature and reload with next batch of wafers.

In such a deposition process, the furnace temperature was first maintained at 270° C. during a 4 minute aluminum deposition period with a TIBA flow rate of 200 ml/min. (NPT) at 1 torr. Silane was then admitted and the temperature was raised to 390° C. to effect gas phase alloying with a silane flow rate of 150 ml/min. (NPT) at a pressure of 0.3 torr. This produced an alloy film 1 micron in thickness and containing 0.4 atomic % silicon. No etch pits could be seen in contact windows of IC test wafers treated by this process, whereas it was found that the omission of silane during the heat up stage resulted in severe pitting of the aluminum films in every case.

In a modification of the process described herein, an inert gas, e.g. argon or nitrogen is admitted via reservoir 24 and valve 23 into the furnace 13 at regular intervals during the deposition process. The pressure in the furnace 13 is temporarily raised above the vapor pressure of TIBA or TIBA/DIBAH mixture contained in the evaporator thus temporarily restricting the alkyl supply. This permits periodic removal of the reaction products from the furnace 13, which are swept away together with inert gas into the pump. In further embodiments of the process the aluminum alkyl or mixture of alkyl may be injected into the furnace 13 via an atomizing device. Alternatively the liquid alkyl or mixture of alkyl may be admitted via a metering device to a flash evaporation or a continuous evaporation arrangement.

In a further embodiment a sequential process may be employed wherein the aluminum coating is deposited by techniques other than chemical vapor deposition. For example, vacuum evaporation or sputtering may be employed. The aluminum film is then alloyed with silicon by exposure to silane while raising the temperature to between 350° C. and 550° C. as previously described herein.

The term semiconductor device as employed herein is understood to refer both to discrete devices and integrated circuits.

Whereas this invention has been described with respect to specific embodiments thereof, it will be understood that various changes and modifications will be suggested to one skilled in the art, and it is intended to encompass such changes and modifications as are within the scope of the appended claims.

What is claimed is:

1. A process for metallizing a semiconductor device with an aluminum/silicon alloy film, the process including exposing the device to a substantially homogeneous mixture of an aluminum alkyl vapour and silane at a temperature between 250° and 500° C. and at a reduced pressure to cause spontaneous deposition from said mixture of an aluminum/silicon alloy film comprising aluminum containing just enough silicon to saturate said aluminum at the deposition temperature.

2. A process as claimed in claim 1 and wherein the alloy coating is deposited on the semiconductor device at a temperature within the range 300° to 400° C.

3. A process as claimed in claim 1 or 2 and in which the aluminum alkyl/silane vapour mixture is diluted with an inert gas.

4. A process as claimed in claim 1 or 2, and in which the aluminum alkyl/silane mixture includes hydrogen.

5. A process as claimed in claim 1, including exposing the device at a temperature of 350° C. and a pressure of 4 torr to a substantially homogeneous mixture of silane and tri-isobutyl aluminum (TIBA), the silane and TIBA being admitted to the atmosphere surrounding the device at substantially equal flow rate.

6. A process as claimed in claim 1 or 2 and in which the partial pressure of silane is in the range of 0.25 to 0.3 torr.

7. A process as claimed in claim 1 and in which the aluminum alkyl is selected from the group consisting of tri-isobutyl aluminum, di-isobutyl aluminum hydride, or mixtures thereof.

8. A process as claimed in claim 1 and wherein an inert gas is periodically supplied to the region surrounding the device or devices so as to disperse the vapour phase reaction products, the gas pressure exceeding the vapour pressure of alkyl.

9. A process as claimed in claim 1 and in which the aluminum alkyl vapour is provided by evaporation from a quantity of the liquid alkyl.

10. A process as claimed in claim 1 and in which the silicon device is cleaned by exposure to an active vapour prior to metallization.

11. A process as claimed in claim 1 and wherein the aluminum alkyl is dispersed from an evaporator.

12. A process as claimed in claim 1 and wherein the aluminum alkyl is dispersed in liquid form from an atomizing device.

13. A process as claimed in claim 1 and in which the surface of the semiconductor device is activated by exposure to titanium tetrachloride prior to exposure to said aluminum alkyl vapour containing silane.

14. A process as claimed in claim 1 wherein the semiconductor device is silicon.

* * * * *